(12) United States Patent
Negoro

(10) Patent No.: US 8,878,599 B2
(45) Date of Patent: Nov. 4, 2014

(54) SEMICONDUCTOR INTEGRATED CIRCUIT DEVICE AND SUPPLY VOLTAGE SUPERVISOR

(75) Inventor: Takaaki Negoro, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 717 days.

(21) Appl. No.: 13/196,983

(22) Filed: Aug. 3, 2011

(65) Prior Publication Data

US 2012/0032733 A1 Feb. 9, 2012

(30) Foreign Application Priority Data

Aug. 6, 2010 (JP) ................. 2010-177943

(51) Int. Cl.
*G06F 1/00* (2006.01)
*G06F 3/16* (2006.01)
*G06F 1/28* (2006.01)
*H01L 27/088* (2006.01)
*H01L 27/092* (2006.01)
*G06F 1/30* (2006.01)
*H01L 27/12* (2006.01)

(52) U.S. Cl.
CPC ......... *H01L 27/0883* (2013.01); *H01L 27/1203* (2013.01); *G06F 1/28* (2013.01); *H01L 27/092* (2013.01); *G06F 1/30* (2013.01)
USPC .......................................... 327/537; 323/314

(58) Field of Classification Search
USPC ........... 323/312–316; 327/142, 143, 537–539
See application file for complete search history.

(56) References Cited

U.S. PATENT DOCUMENTS

| 4,096,430 | A | * | 6/1978 | Waldron | 323/281 |
| 6,998,902 | B2 | * | 2/2006 | Sugimura | 327/539 |
| 7,164,593 | B2 | * | 1/2007 | Ikeda | 365/63 |
| 7,714,606 | B2 | * | 5/2010 | Ozawa et al. | 326/30 |
| 8,067,976 | B2 | * | 11/2011 | Sumita | 327/535 |
| 2006/0263992 | A1 | * | 11/2006 | Chen et al. | 438/301 |

FOREIGN PATENT DOCUMENTS

| JP | 2001-119031 | 4/2001 |
| JP | 2002-134752 | 5/2002 |
| JP | 4458457 | 2/2010 |
| JP | 2010-245484 | 10/2010 |
| JP | 2011-40690 | 2/2011 |

* cited by examiner

*Primary Examiner* — Adolf Berhane
*Assistant Examiner* — Emily P Pham
(74) *Attorney, Agent, or Firm* — Cooper & Dunham LLP

(57) ABSTRACT

A semiconductor integrated circuit device includes a power-supply terminal to which a power-supply voltage is input; and multiple MOS transistors including an Nch deplete mode MOS transistor functioning as a current source and at least one Pch enhancement mode MOS transistor formed on a silicon-on-insulator substrate including a silicon substrate, a buried-oxide film, and a silicon activate layer, each of the multiple MOS transistors dimensioned so that a bottom of a source diffusion layer and a bottom of a drain diffusion layer reach the buried-oxide film, the at least one Pch enhancement mode MOS transistor being connected to the supply terminal through the Nch depletion mode MOS transistor. The Nch depletion mode MOS transistor has electrical characteristics such that a source voltage thereof is higher than a silicon substrate voltage thereof and a saturation current of the Nch depletion mode MOS transistor is decreased.

20 Claims, 8 Drawing Sheets

SEMICONDUCTOR INTEGRATED CIRCUIT DEVICE AND SUPPLY VOLTAGE SUPERVISOR

CROSS-REFERENCE TO RELATED APPLICATIONS

This patent application is based on and claims priority pursuant to 35 U.S.C. §119 to Japanese Patent Application No. 2010-177943, filed on Aug. 6, 2010, in the Japan Patent Office, the entire disclosure of which is hereby incorporated herein by reference.

BACKGROUND

1. Technical Field

The present disclosure relates to a semiconductor integrated circuit device and a supply voltage supervisor included therein.

2. Description of the Background Art

In order to reduce power consumption and save power in an integrated circuit (IC), metal oxide semiconductor (MOS) transistors using silicon-on-insulator (SOI) substrates have been developed, as proposed for example in JP-2002-134752-A and JP-2001-119031-A. In the SOI substrate, forming bottoms of a source terminal and a drain terminal to reach a buried-oxide (BOX) film, junction capacitance of the MOS transistor can be lessened.

FIG. 7 is a schematic cross-sectional diagram illustrating a MOS transistor formed on an SOI substrate 200. As illustrated in FIG. 7, the MOS transistor formed on the SOI substrate 200 includes five terminals: A source terminal 101 as a voltage supply portion, a drain terminal 103, a gate terminal 105, a body terminal 107, and a silicon substrate terminal 109. Reference numeral 111 represents a buried-oxide (BOX) film. The silicon substrate (terminal) 109 is positioned beneath the BOX film 111 and functions as a support substrate to support the BOX film 111. Reference numeral 113 represents an element-separation oxide film. Reference numeral 115 represents a gate oxide film. The source terminal 101, the drain terminal 103, the body terminal 107, and the element-separation oxide film 113 are formed on a silicon active layer of the SOI substrate 200. The bottoms of the source terminal 101 and the drain terminal 103 reach the BOX film 111.

FIG. 8 shows circuitry illustrating a supply voltage supervisor 100 that is one example of a semiconductor integrated circuit that includes multiple MOS transistors formed on the SOI substrates. An input terminal Vsense, a power-supply terminal VDD, a terminal (detection terminal) Vdet, and a ground terminal GND are provided in the supply voltage supervisor 100. The terminal Vsense functions as an input terminal of the supply voltage supervisor 100. The supply voltage supervisor 100 includes negative-channel (Nch) MOS transistors M1, M2, M6, M8, and M9, positive-channel (Pch) MOS transistors M3, M4, M5, and M7, and resistors R1, R2, and R3. The supply voltage supervisor 100 detects an abnormal power supply voltage that has input to the input terminal Vsense. In the supply voltage supervisor 100, the Nch MOS transistor M2 is depletion mode-type transistor and other MOS transistor M1, M3, M4, M5, M6, M7, M8, and M9 are enhancement mode-type transistors. The Pch MOS transistors M3 and M4 constitute a current mirror circuit for a saturation current of the Nch depletion mode MOS transistor M2, which functions as a constant current load.

The inventor of the present disclosure measured electric characteristics in MOS transistors formed on SOI substrates. Relating to two types of Nch MOS transistors, a gate voltage and a drain voltage were set to 5 V (volt), a source voltage and a body voltage were set to a ground voltage (0 V), and a silicon substrate voltage (Vsub) was changed from 0V (ground voltage) to −50 V in tens of volts. Relating to a Pch MOS transistor, a gate voltage and a drain voltage were set to −5 V, a source voltage and a body voltage were set to a ground voltage (0 V), and a silicon substrate voltage (Vsub) was changed from 0V to −50 V in tens of volts.

FIG. 9 is a graph showing electric characteristics of the Nch enhancement mode MOS transistor. FIG. 10 is a graph showing electric characteristics of the Nch depletion mode MOS transistor. FIG. 11 is a graph showing electric characteristics of the Pch enhancement mode MOS transistor. In FIGS. 9 through 11, vertical axes of the graph are drain currents Id (The units of measurement are ampere (A)), and horizontal axes are silicon substrate voltages Vsub (The units of measurement are volt (V)). The respective MOS transistors were measured at temperatures of 30° C., 50° C., 75° C., 100° C., and 125° C.

It has been experimentally proven that, when the silicon substrate voltage Vsub applied to the silicon substrate 109 was changed, operating currents of the MOS transistors formed on the SOI substrates were changed, even though the MOS transistor were operated while losing a substrate bias effect (body effect) by setting the source voltage of the source terminal equal to the body voltage of the body terminal. As the silicon substrate voltage Vsub applied to the silicon substrate 109 is decreased, the saturation currents of the Nch MOS transistors were decreased. By contrast, as the silicon substrate voltage Vsub applied to the silicon substrate is decreased, the saturation current of the Pch MOS transistor was increased.

That is, when the MOS transistor formed on the SOI substrate is used in a source follower circuit in a state in which the silicon substrate of the SOI substrate is connected to the ground voltage (GND), as the power supply voltage is increased, the saturation current of the Nch MOS transistor is decreased, or the saturation current of the Pch MOS transistor is increased. In addition, it has been proven that the change of the electrical characteristics of the Pch MOS transistor is greater than that of the Nch MOS transistor.

Such electrical characteristics of the MOS transistors formed on the SOI substrate may cause a failure in the semiconductor integrated circuit. For example, in the supply voltage supervisor 100 shown in FIG. 8, when the power supply voltage supplied to the power-supply terminal VDD is set greater, the source voltages of the Pch MOS transistors M3 and M4 become separated from the silicon substrate voltage Vsub. Then, with reference to FIG. 11, the saturation current of the Pch MOS transistors M3 and M4 are increased, and finally, the Pch MOS transistors M3 and M4 cannot act as the current mirror circuit for the saturation current of the Nch depletion mode MOS transistor M2. In another case, threshold voltages of inverters inv1 and inv2 that are output destinations of a differential amplifier OPA1 are changed due to the change of the electrical characteristics of the MOS transistors, and the supply voltage supervisor 100 may mistakenly detect the power supply voltage.

In order to alleviate the change of the electrical characteristics of the MOS transistor formed on the SOI substrate, it is conceivable that the bottoms of the source terminal and the drain terminal can be prevented from reaching the BOX film by thickening the BOX film of the SOI substrate or by thickening the silicon layer of the SOI substrate.

However, if the BOX film is thickened, defects in manufacture may occur due to warpage of the silicon substrate. In addition, if the silicon layer is thickened, because the junction capacitance of the MOS transistor may be generated in the bottoms of the source terminal and the drain terminal, and the junction capacitance may be increased, which hinders efforts to reduce power consumption.

SUMMARY

In one aspect of this disclosure, there is a provided a semiconductor integrate circuit device that includes a power-supply terminal to which a power-supply voltage is input; and multiple MOS transistors including an Nch deplete mode MOS transistor functioning as a current source and at least one Pch enhancement mode MOS transistor formed on a silicon-on-insulator substrate including a silicon substrate, a buried-oxide film, and a silicon activate layer, each of the multiple MOS transistors dimensioned so that a bottom of a source diffusion layer and a bottom of a drain diffusion layer reach the buried-oxide film, the at least one Pch enhancement mode MOS transistor connected to the supply terminal through the Nch depletion mode MOS transistor. The Nch depletion mode MOS transistor has electrical characteristics such that a source voltage thereof is higher than a silicon substrate voltage and a saturation current thereof is decreased.

In another aspect of this disclosure, there is a provided a supply voltage supervisor to monitor a power-supply voltage, including a power-supply terminal to which the power-supply voltage is input, an input terminal to which the power-supply voltage to be monitored is input, an output terminal to which an abnormal power-supply voltage detection signal is output, an input-voltage divider circuit, a first differential amplifier, a first inverter, a second inverter, an output transistor, an output resistor, and a constant current source. The first differential amplifier includes a reference voltage generation pair constituted by a first Nch enhancement mode MOS transistor and a second Nch depletion mode MOS transistor to generate a reference voltage; and a constant current load constituted by a third and a fourth Pch enhancement mode MOS transistor pair forming a current mirror circuit. The first differential amplifier amplifies difference of voltages between the divided voltage from the input-voltage divider circuit and the reference voltage generated in the reference voltage generation pair. The first inverter includes a fifth Pch enhancement mode MOS transistor and a sixth Nch enhancement mode MOS transistor. The second inverter includes a seventh Pch enhancement mode MOS transistor and an eighth Nch enhancement mode MOS transistor. The output transistor constituted by a ninth Nch enchantment mode MOS transistor switches on when the divided voltage is smaller than the reference voltage to detect an abnormal power-supply voltage. The output resistor pulls up the output transistor. The constant current source constituted by a tenth Nch depletion mode MOS transistor through which the third, fourth, fifth, and seventh Pch enhancement mode MOS transistors are connected to the power-supply terminal. The constant current source drops the power-supply voltage input from the power-supply terminal and causes the first differential amplifier, the first inverter, and the second inverter to operate at a voltage dropped from the power-supply voltage input from the power-supply terminal. The multiple MOS transistors are formed on a silicon-on-insulator substrate including a silicon substrate, a buried-oxide film, and a silicon activate layer, each of the multiple MOS transistors dimensioned so that a bottom of a source diffusion layer and a bottom of a drain diffusion layer reach the buried-oxide film. The tenth Nch depletion mode MOS transistor constituting the constant current source has electrical characteristics such that a source voltage thereof is higher than a silicon substrate voltage and a saturation current of the tenth Nch depletion mode MOS transistor is decreased.

BRIEF DESCRIPTION OF THE DRAWINGS

A more complete appreciation of the aforementioned and other features, aspects and advantages will be better understood by reference to the following detailed description when considered in connection with the accompanying drawings, wherein.

DETAILED DESCRIPTION OF PREFERRED EMBODIMENTS

Figure 1:
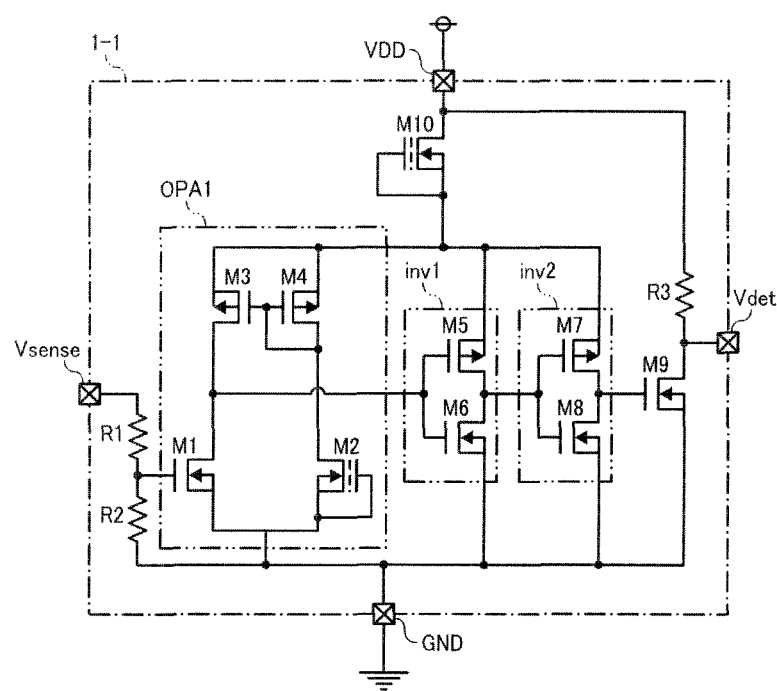
FIG. 1 is a diagram showing circuitry illustrating a supply voltage supervisor according to a first illustrative embodiment.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result. Referring now to the drawings, wherein like reference numerals designate identical or corresponding parts throughout the several views, particularly to FIG. 1, a supply voltage supervisor included in a semiconductor integrated circuit device according to an illustrative embodiment is described.

First Embodiment

FIG. 1 is a diagram showing circuitry illustrating a supply voltage supervisor 1-1 that is an integrated circuit for monitoring power-supply voltage. The below embodiments are formed on silicon-on-insulator (SOI) substrates. A bottom of a source diffusion layer reaches a silicon active layer of the SOI substrate, and a bottom of a drain diffusion layer reaches a buried-oxide (BOX) film.

As illustrated in FIG. 1, the supply voltage supervisor 1-1 includes a power-supply terminal VDD, ground terminals GND, an input terminal (sensing terminal) Vsense, and an output terminal (detection terminal) Vdet. A silicon substrate, constituting a support substrate to support the SOI substrate, is connected to the ground terminal GND. The power-supply terminal VDD is connected to a power source. The ground terminal GND is connected to a ground voltage. A power supply voltage to be monitored is input to the input terminal Vsense. The supply voltage supervisor 1-1 outputs a high-level signal through the output terminal Vdet when the power-supply voltage input to the terminal Vsense is higher than or equal to a predetermined voltage, and outputs a low-level signal through the output terminal Vdet when the power-supply voltage is lower than the predetermined voltage. The low-level signal is an abnormal power-supply detection signal.

The supply voltage supervisor 1-1 includes a differential amplifier OA1 including MOS transistors M1, M2, M3, and M4, an inverter circuit inv1 including MOS transistors M5 and M6, an inverter circuit inv2 including MOS transistors M7, and M8, a MOS transistor M9, resistors R1, R2, and R3, and a negative channel (Nch) depletion mode MOS transistor M10 for a constant current source.

In the supply voltage supervisor 1-1 of FIG. 1, the Nch MOS transistor M1 is an enhancement mode type transistor and the Nch MOS transistor M2 is a depletion mode-type transistor. Relating to the Nch enhancement mode MOS transistor M1, the drain terminal is connected to the power-supply terminal VDD through the Nch enhancement mode transistor M3 and the Nch depletion mode transistor M10, the source terminal and the body terminal are connected to the ground terminal GND, and the gate terminal is connected to a junction node between the resistors R1 and R2 that are connected in series. The resistors R1 and R2 are wired in this order between the input terminal Vsense and the ground terminal GND. The pair of resistors R1 and R2 constitutes an input voltage divider circuit to divide the power-supply voltage input from the input terminal Vsense for output as a divided voltage.

Relating to the Nch depletion mode MOS transistor M2, the drain terminal is connected to the power-supply terminal VDD through the Pch MOS transistor M4 and the Nch depletion mode transistor M10, and the source terminal, the body terminal, and the gate terminal are connected to the ground terminal GND. The transistors M1 and M2 constitute a reference voltage generation pair to generate a reference voltage.

The Pch MOS transistors M3 and M4 are the enhancement mode-type transistors. The gate terminals (gate electrodes) of the Pch MOS transistors M3 and M4 are connected to each other, which are connected to the drain terminal of the Pch MOS transistor M4. The source terminals and body terminals of the Pch MOS transistors M3 and M4 are connected to the power-supply terminal VDD through the Nch depletion mode transistor M10. The Pch MOS transistors M3 and M4 constitute a current mirror circuit for the saturation current of the Nch depletion mode MOS transistor M2, which functions as a constant current load. The MOS transistors M1, M2, M3, and M4 constitute a differential amplifier OPA1. The differential amplifier OA1 serves as a first differential amplifier. The differential amplifier OA1 amplifies difference of voltages between the divided voltage from the input-voltage divider circuit (resistors R1 and R2) and the reference voltage generated in the reference voltage generation pair (transistors M1 and M2).

The Pch MOS transistor M5 and the Nch MOS transistor M6 that are connected in series, which are wired in this order between the power-supply terminal VDD through the Nch depletion mode transistor M10 and the ground terminal GND. The MOS transistors M5 and M6 are the enhancement mode-type transistor, and the MOS transistors M5 and M6 constitute an inverter 1. The inverter 1 serves as a first inverter. The gate terminals of the MOS transistors M5 and M6 are connected to a junction node between the MOS transistors M1 and M3.

The Pch MOS transistor M7 and the Nch MOS transistor M8 that are connected in series, which are wired in this order between the power-supply terminal VDD through the Nch depletion mode transistor M10 and the ground terminal GND. The MOS transistors M7 and M8 are the enhancement mode-type transistors, and the MOS transistors M7 and M8 constitute an inverter 2. The inverter 2 serves as a second inverter. The gate terminals of the MOS transistors M7 and M8 are connected to a junction node between the MOS transistors M5 and M6, that is, an output terminal of the inverter inv1.

The resistor R3 and the Nch MOS transistor M9 are connected in series, which are wired in this order between the power-supply terminal VDD and the ground terminal GND. The Nch MOS transistor M9 is the enhancement mode-type transistor. The gate terminal of the Nch MOS transistor M9 is connected to a junction node between the MOS transistors M7 and M8, that is, an output terminal of the inverter 2. The body terminal of the Nch MOS transistor M9 is connected to the ground terminal GND. The terminal Vdet is connected a junction node between the resistor R3 and the Nch MOS transistor M9. The terminal Vdet is an output terminal of the supply voltage supervisor 1-1. The Nch MOS transistor M9 functions as an output transistor to switch on when the divided voltage is smaller than the reference voltage to detect an abnormal power-supply voltage. The resistor R3 functions as an output resistor to pull up the output transistor M9.

With this configuration, an input current targeted for monitoring that is input to the input terminal Vsense is divided by the resistors R1 and R2, and the supply voltage supervisor 1-1 monitors the divided current. More specifically, when the divided voltage is smaller than a reference voltage generated in the Nch enhancement mode MOS transistor M1 and the Nch depletion mode MOS transistor M2, the Nch MOS transistor M9 that is pulled up by the resistor R3 is turned on, and an output signal that is output through the output terminal Vdet changes from high to low. Thus, the supply voltage supervisor 1-1 detects an abnormal power-supply voltage that has input to the input terminal Vsense.

Figure 8:
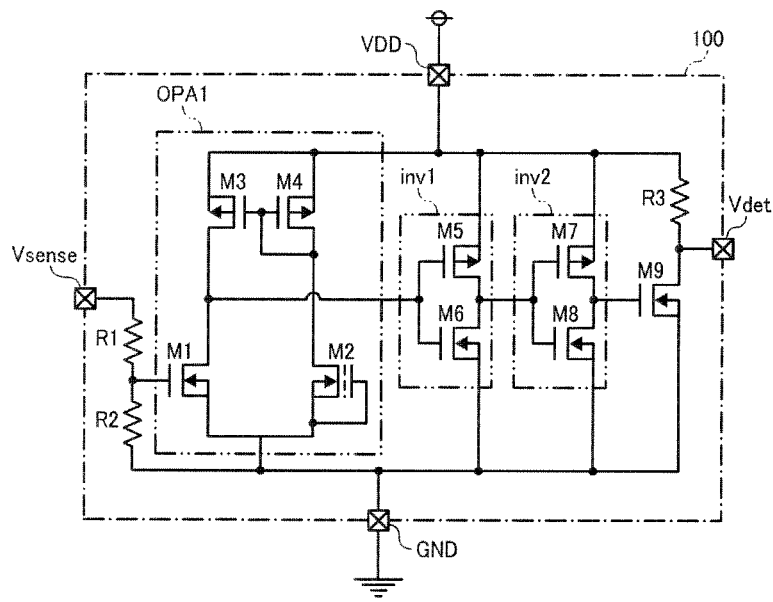
FIG. 8 shows circuitry illustrating a related-art supply voltage supervisor that is one example of integrated circuit constituted by multiple MOS transistors formed on the SOI substrates shown in FIG. 7.
Figure 9:
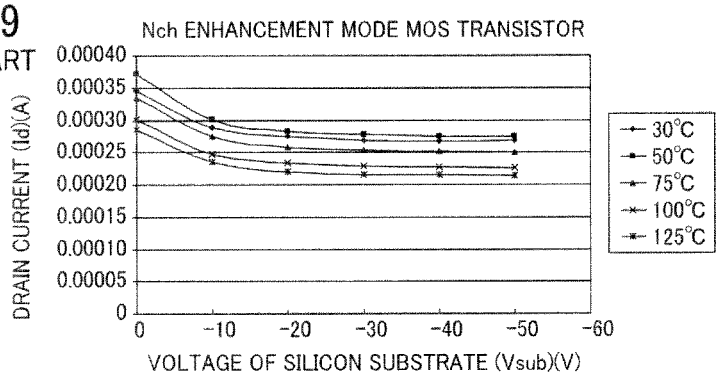
FIG. 9 is a graph showing electrical characteristics of an Nch enhancement mode MOS transistor when a silicon substrate voltage thereof is changed.
Figure 10:
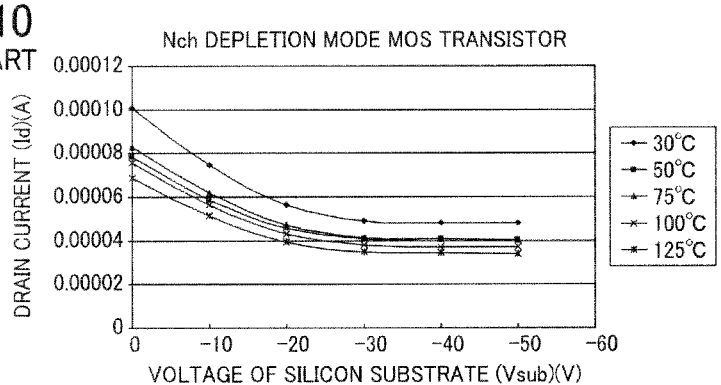
FIG. 10 is a graph showing electrical characteristics of an Nch depletion mode MOS transistor when a silicon substrate voltage thereof is changed.
Figure 11:
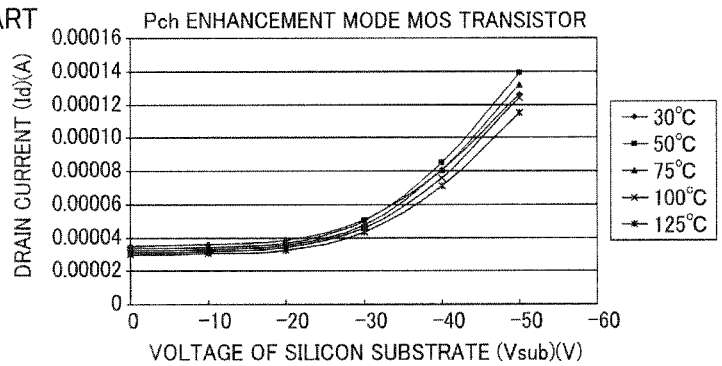
FIG. 11 is a graph showing electrical characteristics of a Pch enhancement mode MOS transistor when a silicon substrate voltage thereof is changed.

The supply voltage supervisor 1-1 has a configuration circuit that includes a configuration the differential amplifier OA1 including the MOS transistors M1, M2, M3, and M4, the inverter circuit inv1 including the MOS transistors M5 and M6, the inverter circuit inv2 including the MOS transistors M7 and M8, the MOS transistor M9, and the resistors R1, R2, and R3, which is identical to the supply voltage supervisor 100 of the related art shown in FIG. 8.

However, the supply voltage supervisors 1-1 through 1-5 according to embodiments of the preset disclosure further include the negative channel (Nch) depletion mode MOS transistor M10 for a constant current source. In the present embodiment, a source terminal, a gate terminal, and a body terminal of the MOS transistor M10 are wired, and the MOS transistor M10 functions as a constant current source and has electrical characteristics such that the source voltage is higher than the silicon substrate voltage, and therefore a saturation current of the MOS transistor M10 is decreased. One terminal of the MOS transistor M10 is connected to the power-supply terminal VDD and the other terminals thereof are connected to the differential amplifier OA1 and the inverters inv1 and inv2.

With this configuration, the Pch enhancement mode MOS transistors M3, M4, M5, and M7 are connected to the power-supply terminal VDD through the Nch depletion mode MOS transistor M10 for the constant current source. The MOS transistor M10 is dimensioned so that a capacity of the MOS transistor M10 can generate a current to be consumed in the differential amplifier OA1 and the inverters inv1 and inv2.

The differential amplifier OA1 including the Pch MOS transistors M3 and M4, the inverter inv1 including the Pch MOS transistor M5, and the inverter inv2 including the Pch MOS transistor M7 operate at a voltage dropped by the Nch depletion mode MOS transistor M10. Therefore, even when the power-supply voltage to be input to the power-supply terminal VDD in the supply voltage supervisors 1-1 is high, the differential amplifier OA1 and the inverters inv1 and inv2 can operate stably without thickening the BOX film or the silicon layer of the SOI substrate. In addition, the power-supply voltages used in the differential amplifier OA1 and the inverters inv1 and inv2 are dropped, which can reduce power consumption and save power.

Second Embodiment

Figure 2:
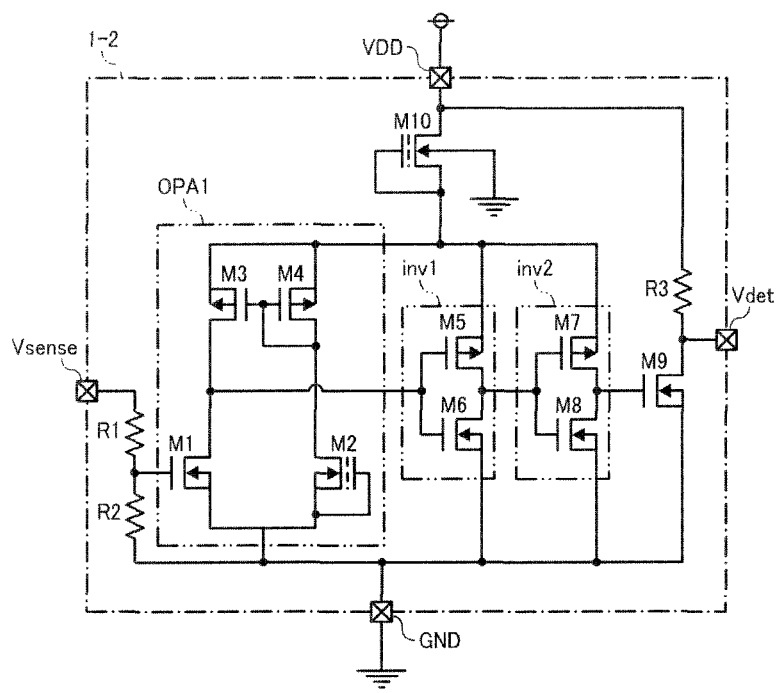
FIG. 2 is a diagram showing circuitry illustrating a supply voltage supervisor according to a second illustrative embodiment.

FIG. 2 is a diagram showing circuitry illustrating a supply voltage supervisor 1-2 according to a second embodiment.

As compared with the supply voltage supervisor 1-1, in the supply voltage supervisor 1-2 of the present embodiment, a body terminal of the Nch depletion mode MOS transistor M10 for the constant current source is connected to a ground terminal. Although the body terminal of the MOS transistor M10 is connected to a ground voltage shown in FIG. 2 for simplification and ease of understanding, the body terminal of the MOS transistor M10 is connected to the ground terminal (GND).

The Nch depletion mode MOS transistor M10 for the constant current source whose body terminal is connected to the ground voltage also functions as the constant current source and has electrical characteristics such that a source voltage thereof is higher than a silicon substrate voltage thereof, and therefore the saturation current of the Nch depletion mode MOS transistor 10 is decreased.

Relating to the Nch MOS transistor M10, for example, when the power-supply voltage is high and a current cannot flow a load current because a substrate bias effect (body current) is large, the body voltage and the source voltage is set to be equal by connecting the source terminal, the gate terminal, and the body terminal of the Nch MOS transistor M10 respectively as shown in FIG. 1. Alternatively, when operation is performed in a linear area because the substrate bias effect is small, the body voltage is set to the ground voltage by connecting the body terminal with the ground terminal as shown in FIG. 2.

Although the MOS transistor M9 is connected to the power-supply terminal VDD through the resistor R3 in the embodiments shown in FIGS. 1 and 2, the MOS transistor M9 may be connected to the power-supply terminal VDD through the resistor R3 and the MOS transistor M10.

Third Embodiment

Figure 3:
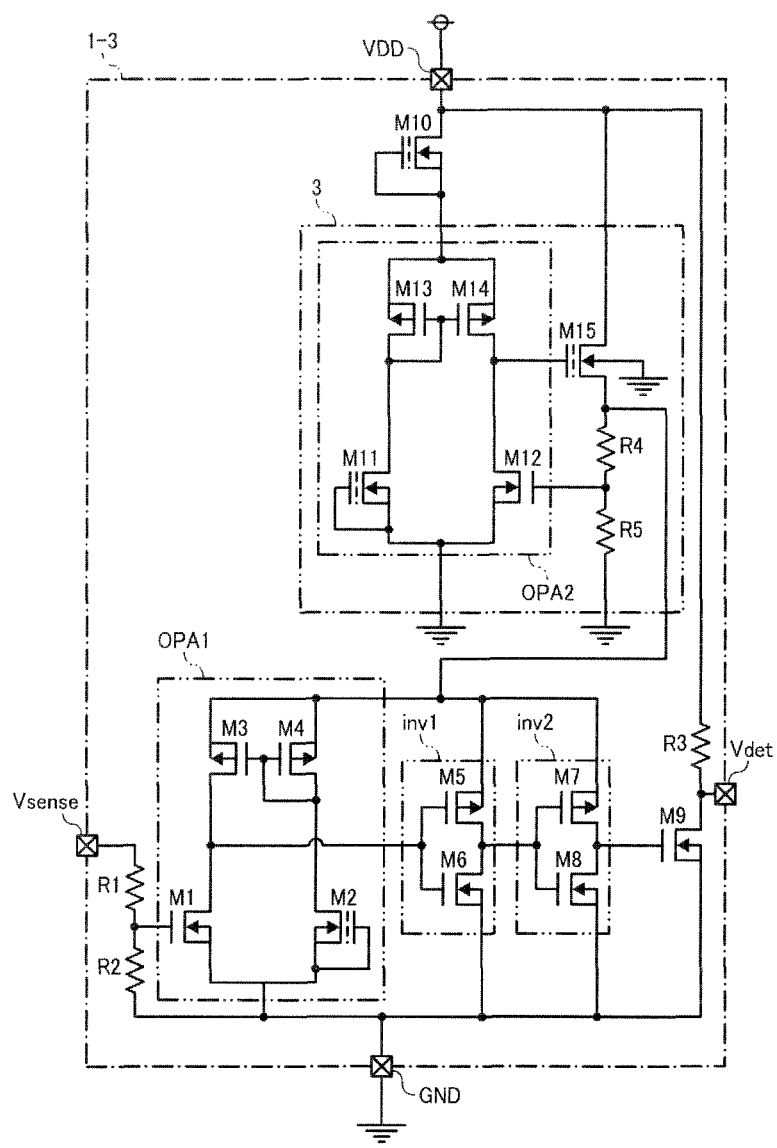
FIG. 3 is a diagram showing circuitry illustrating a supply voltage supervisor according to a third illustrative embodiment.

FIG. 3 is a diagram showing circuitry illustrating a supply voltage supervisor 1-3 according to a third embodiment.

As compared with the supply voltage supervisor 1-1 shown in FIG. 1, the supply voltage supervisor 1-3 further includes a regulator circuit 3. The regulator circuit 3 includes an Nch depletion mode MOS transistor M11, an Nch enhancement mode MOS transistor M12, Pch enhancement mode MOS transistors M13 and M14, an Nch depletion mode transistor M15, and resistors R4 and R5. The regulator circuit 3 adjusts the power-supply voltage from the power supply voltage VDD. In this circuit, the differential amplifier OA and the inverters inv1 and inv2 are operated by an output of the regulator circuit 3 as the power-supply voltage when the power supply voltage input to the power-supply terminal is unstable. The resistors R4 and R5 constitute a resistive divider circuit to stabilize an output voltage of the regulator circuit 3.

Relating to the Nch depletion mode MOS transistor M11, the drain terminal of the Nch MOS transistor M11 is connected to the drain terminal of the Pch MOS transistor M13, and the source terminal, the body terminal, the gate terminal are connected to the ground terminal (ground voltage shown in FIG. 3). Relating to the Nch enhancement mode MOS transistor M12, the drain terminal of the Nch MOS transistor M12 is connected to the drain terminal of the Pch MOS transistor M14, the source terminal and the body terminal are connected to a ground terminal GND, and the gate terminal thereof is connected to a junction node between the register R4 and R5 (output terminal of the resistive divider circuit) in series. The Nch depletion mode MOS transistor M11 and the Nch enhancement mode MOS transistor M12 constitute a reference voltage generation pair.

The gate terminal of the Pch MOS transistor M13 and the gate terminal of the Pch MOS transistor M14 are connected to each other, which are connected to the drain terminal of the Pch MOS transistor M13. The source terminals of the Pch MOS transistors M13 and M14 and the body terminals of the Pch MOS transistors M13 and M14 are connected to the source terminal of the Nch depletion mode MOS transistor M10 for the constant current source. The Pch MOS transistors M13 and M14 constitute a current mirror circuit and function as a constant current load.

The Nch MOS transistor M15, the resistors R4 and R5 are connected in series, which are wired in this order between the power-supply terminal VDD and the ground terminal GND (ground voltage, shown in FIG. 3). The Nch MOS transistor M15 functions as an output transistor (drive transistor) of the regulator circuit 3.

The Nch MOS transistor M15 is the depletion mode-type transistor, because it is necessary to output the power-supply voltage even when the regulator circuit 3 does not operate. The gate terminal of the Nch MOS transistor M15 is connected to the drain terminal of the Pch MOS transistor M14. The resistors R4 and R5 function as a divided resistor circuit.

A junction node between the Nch MOS transistor M15 and the resistor R4 functions as an output terminal of the regulator circuit 3. The regulator circuit 3 stabilizes the output voltage thereof by applying negative feedback by the resistors R4 and R5. The voltage output from the regulator circuit 3 is supplied to the differential amplifier circuit OPA1 and the inverter inv1 and inv2.

The Pch MOS transistors M13 and M14 in the regulator circuit 3 are activated (operated) at a voltage dropped by the Nch depletion mode MOS transistor M10 for the constant current source, which can stabilize the circuit operation in the regulator circuit 3 without thickening the BOX film of the SOI substrate and the silicon layer even when the power-supply voltage output to the power-supply terminal VDD of the supply voltage supervisor 1-3. In addition, by decreasing the power-supply voltage used in the regulator circuit 3 and a next stage of circuit including the differential amplifier circuit OPA1 and the inverter inv1 and inv2, the consumption of the power can be reduced.

Fourth Embodiment

Figure 4:
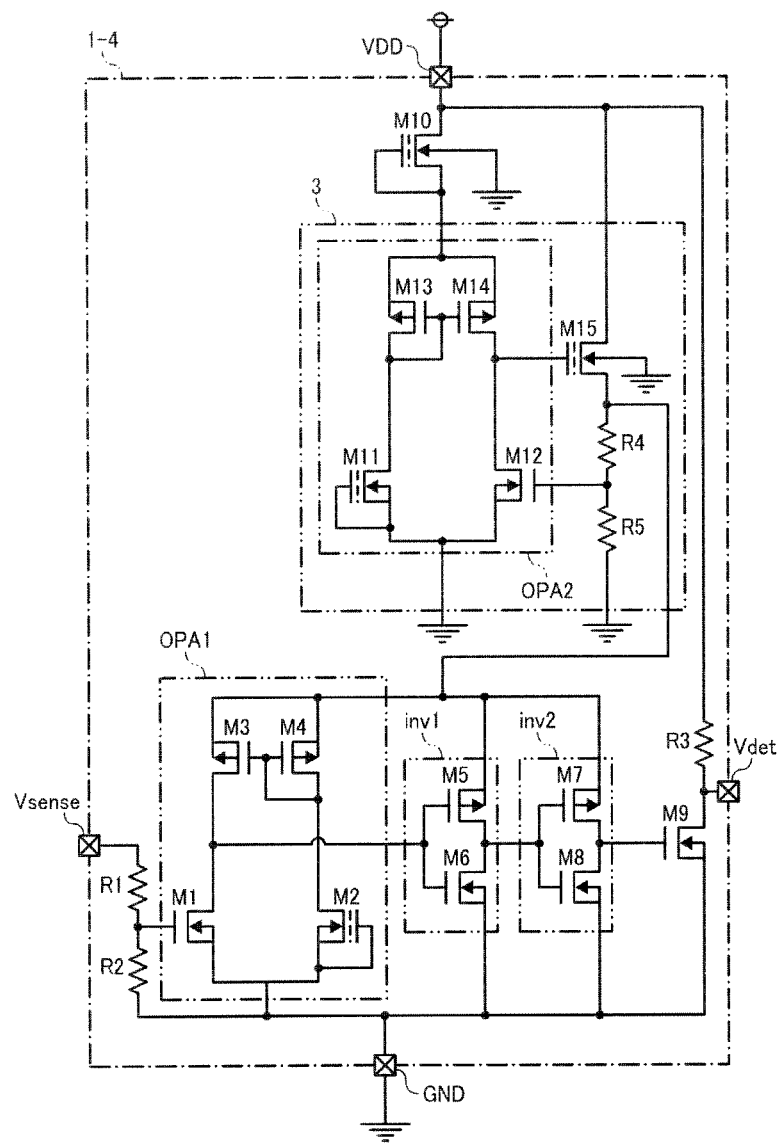
FIG. 4 is a diagram showing circuitry illustrating a supply voltage supervisor according to a fourth illustrative embodiment.

FIG. 4 is circuitry illustrating a supply voltage supervisor 1-4 of a fourth embodiment.

As compared with the supply voltage supervisor 1-3 shown in FIG. 3, in the supply voltage supervisor 1-4 of the present embodiment, the body terminal of the Nch depletion mode MOS transistor M10 for the constant current source is connected to the ground terminal GND (ground voltage shown in FIG. 4).

The Nch depletion mode MOS transistor M10 whose body terminal is connected to the ground voltage functions as the constant current source and has electrical characteristics such that the source voltage thereof is higher than the silicon substrate voltage and therefore a saturation current thereof is decreased. Thus, the supply voltage supervisor 1-4 of the present embodiment can achieve operation and effect similarly to the supply voltage supervisor 1-3 of the third embodiment.

Fifth Embodiment

Figure 5:
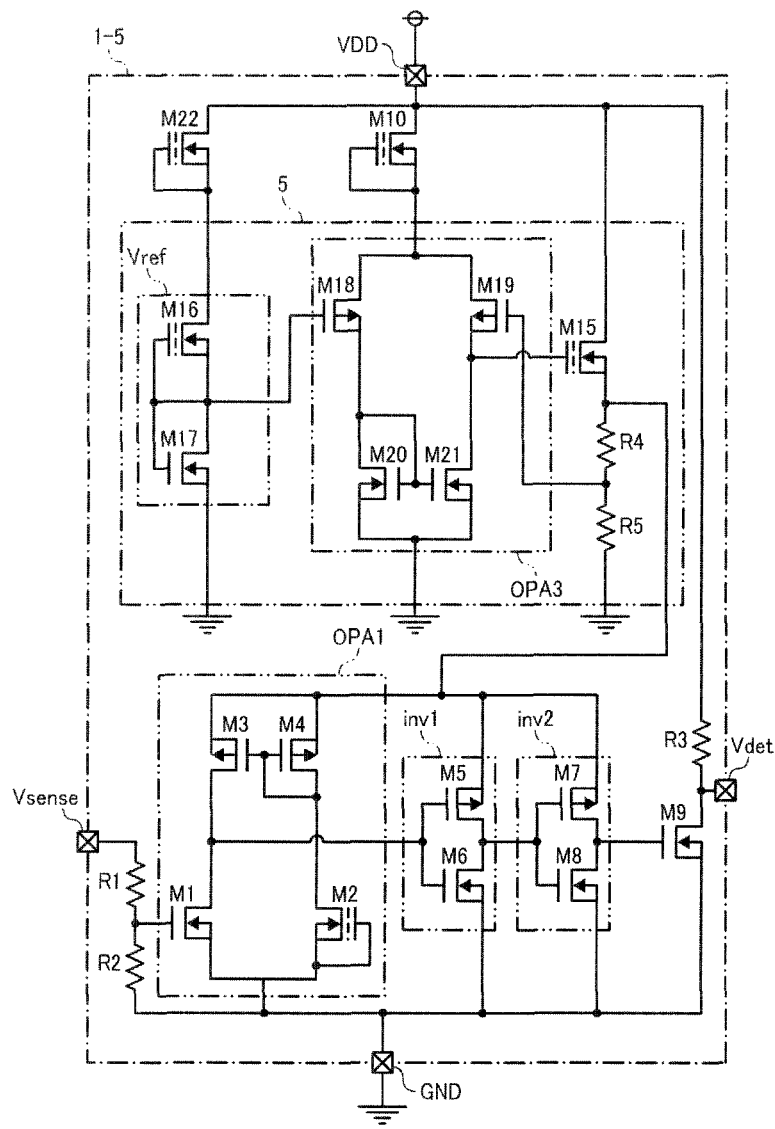
FIG. 5 is a diagram showing circuitry illustrating a supply voltage supervisor according to a fifth illustrative embodiment.

FIG. 5 is circuitry illustrating a supply voltage supervisor 1-5 of a fifth embodiment.

As compared with the supply voltage supervisor 1-1 shown in FIG. 1, the supply voltage supervisor 1-5 further includes a regulator circuit 5, and an Nch depletion mode MOS transistor M22 for a constant current source. In the Nch depletion mode MOS transistor functioning as an additional constant source, the source terminal, the gate terminal, and the body terminal thereof are connected respectively.

The regulator circuit 5 includes a reference voltage generation circuit Vref, a differential amplifier OPA3, an Nch depletion mode MOS transistor M15, and resistors R4 and R5.

The circuit construction of the Nch depletion mode transistor M15 and the resistors R4 and R5 are identical to the circuit construction of the regulator circuit 3 shown in FIGS. 3 and 4. The transistor M15 also serves as a twenty-third Nch depletion mode transistor.

The reference voltage generation circuit Vref is constituted by an Nch depletion mode MOS transistor M16 and an Nch enhancement mode MOS transistor M17, which are connected in series therebetween. The gate terminals of the MOS transistors M16 and M17 are connected to each other, the source terminal and body terminal of the MOS transistor M16 is connected to the drain terminal of the MOS transistor M17, and a junction node between the gate terminals of the MOS transistors M16 and M17 is connected to a junction between the source terminal of the MOS transistors M16 and the drain terminal of the MOS transistor M17 are connected to each other. The drain terminal of the MOS transistor M16 is connected to the power-supply terminal VDD through the MOS transistor M22. The source terminal and the body terminal of the MOS transistor M17 is connected to the ground terminal GND (ground voltage shown in FIG. 5). A voltage between the MOS transistors M16 and M17 functions as an output voltage of the reference voltage generation circuit Vref.

The Nch depletion mode MOS transistor M22 functions as a constant current source for the reference voltage generation circuit Vref. The source terminal, the gate terminal, and the body terminal of the MOS transistor M22 are connected to the drain terminal of the MOS transistor M16, and the drain terminal of the MOS transistor M22 is connected to the power-supply terminal VDD. The MOS transistor M22 is dimensioned so that the current consumed in the reference voltage generation circuit Vref can flow and has electrical characteristics such that the source voltage is higher than the silicon substrate voltage and therefore the saturation current is decreased.

The differential amplifier OPA3 includes a differential input pair constituted by a pair of Pch enhancement mode Pch MOS transistors M18 and M19 and an active load constituted by a pair of Nch enhancement mode MOS transistors M20 and M21.

An output voltage of the reference voltage generation circuit Vref is input to the gate terminal of the MOS transistor M18. A voltage at a junction node between the resistors R4 and R5 that are feedback resistors is input to the gate terminal of the MOS transistor M19. A drain voltage of the MOS transistor M19 functions as an output voltage of the differential amplifier OPA3. Source terminals of the Pch enhancement mode MOS transistors M18 and M19 is connected to the power-supply terminal through the constant current sources constituted by the Nch depletion mode transistor M10. The output voltage of the differential amplifier OPA3 is input to the gate terminal of the MOS transistor M15. The differential amplifier OPA3 is connected in series between the Nch depletion mode MOS transistor M10 for the constant current source and the ground terminal GND (ground voltage shown in FIG. 5).

The differential amplifier OPA3 of the regulator circuit 5 compares a reference voltage from the reference voltage generation circuit Vref and the voltage at a junction node between the resistors R4 and R5, and the regulator circuit 5 stabilizes the output voltage by applying negative feedback. The output voltage from the regulator circuit 5 is supplied to the differential amplifier circuit OPA1 and inverters inv1 and inv.

In general regulator circuits, a Pch MOS transistor is used as a constant current source. However, since the current of the Pch MOS transistor formed on the SOI substrate is fluctuated greatly, in the present embodiment, the Nch depletion mode MOS transistor M10 and M22 whose currents are less to be fluctuated are used as the constant current source.

Since the Pch MOS transistors M18 and M19 in the regulator circuit 5 are activated at a voltage dropped by the Nch depletion mode MOS transistor M10 for the constant current source, which can stabilize the circuit operation in the regulator circuit 5 without thickening the BOX film of the SOI substrate and the silicon layer even when the power-supply voltage output to the power-supply terminal VDD of the supply voltage supervisor 1-5 is high. In addition, by decreasing the power-supply voltage used in the regulator circuit 5 and the next stage of the differential amplifier circuit OPA1 and the inverter inv1 and inv2, the consumption of the power can be reduced.

Sixth Embodiment

Figure 6:
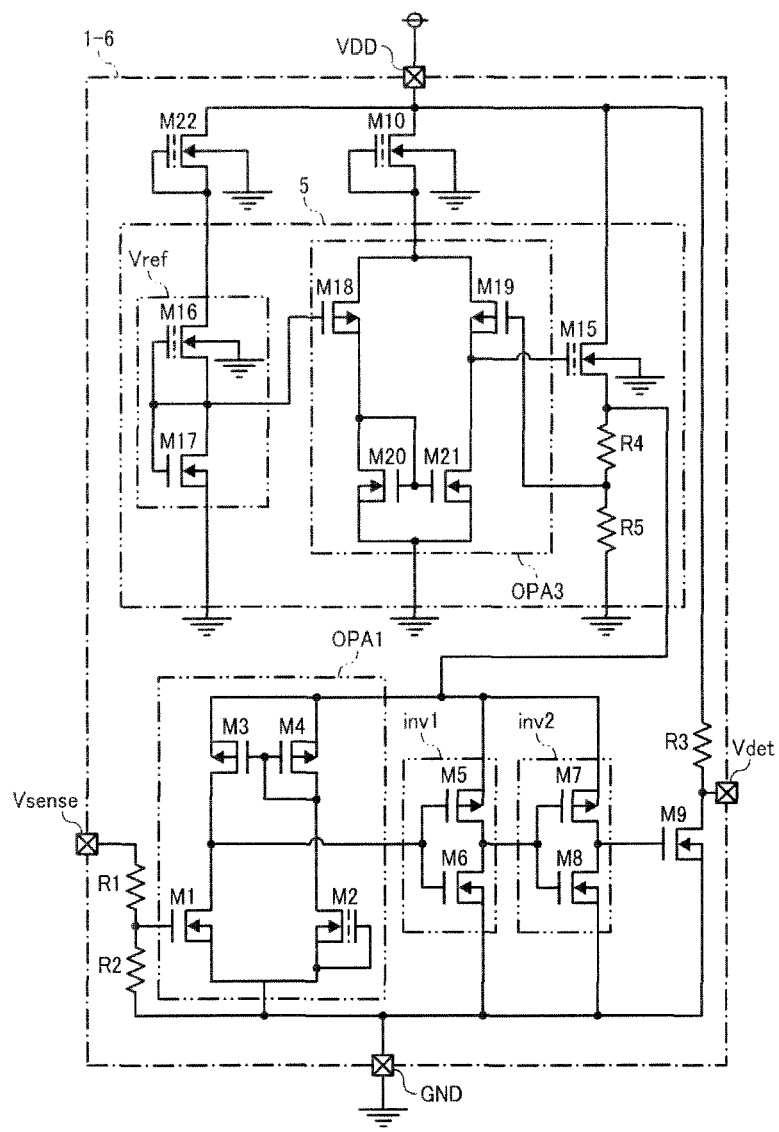
FIG. 6 is a diagram showing circuitry illustrating a supply voltage supervisor according to a sixth illustrative embodiment.
Figure 7:
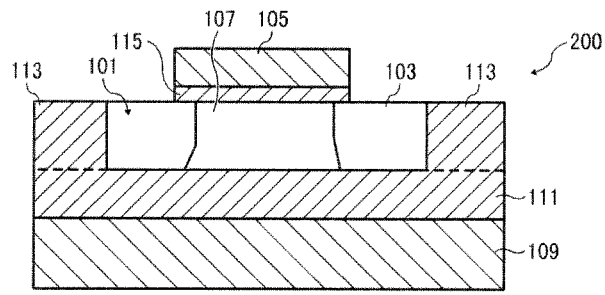
FIG. 7 is a schematic cross-sectional diagram illustrating a MOS transistor formed on a silicon-on-insulator (SOI) substrate.

FIG. 6 is circuitry illustrating a supply voltage supervisor 1-6 of a sixth embodiment.

As compared with the supply voltage supervisor 1-5 shown in FIG. 5, in the supply voltage supervisor 1-6 of the present embodiment, the body terminals of the Nch depletion mode MOS transistors M10, M15, M16, and M22, are connected to the ground terminals GND (ground voltage shown in FIG. 6). Each of the Nch depletion mode MOS transistors M10 and M22 for the constant current source whose body terminal is connected to the ground terminal function as the constant current source and has electrical characteristics such that the source voltages of the Nch depletion mode MOS transistors M10 and M22 are higher than the silicon substrate voltages thereof and therefore saturation currents thereof are decreased. Thus, the supply voltage supervisor 1-6 of the present embodiment can achieve operation and effect similarly to the supply voltage supervisor 1-5 of the fifth embodiment.

In the supply voltage supervisors 1-5 and 1-6 shown in FIGS. 5 and 6, although the Nch depletion mode MOS transistor M10 and M22 corresponding to the constant current source for the differential amplifier OPA3 and the reference voltage generation circuit Vref separately. Alternatively, each of the supply voltage supervisors 1-5 and 1-6 can be include one Nch depletion mode MOS transistor for constant current source that is configured with a common architecture for the differential amplifier OPA3 and the reference voltage generation circuit Vref.

Numerous additional modifications and variations are possible in light of the above teachings. It is therefore to be understood that, within the scope of the appended claims, the disclosure of this patent specification may be practiced otherwise than as specifically described herein.

What is claimed is:

1. A semiconductor integrated circuit device comprising:
   a power-supply terminal to which a power-supply voltage is input; and
   multiple MOS transistors including an Nch deplete mode MOS transistor functioning as a current source and at least one Pch enhancement mode MOS transistor formed on a silicon-on-insulator substrate including a silicon substrate, a buried-oxide film, and a silicon activate layer, each of the multiple MOS transistors dimensioned so that a bottom of a source diffusion layer and a bottom of a drain diffusion layer reach the buried-oxide film, the at least one Pch enhancement mode MOS transistor being connected to the supply terminal through the Nch depletion mode MOS transistor,
   wherein the Nch depletion mode MOS transistor has electrical characteristics such that a source voltage thereof is higher than a silicon substrate voltage thereof and a saturation current of the Nch depletion mode MOS transistor is decreased.

2. The semiconductor integrated circuit device according to claim 1, wherein the Nch depletion mode MOS transistor including a drain terminal, a source terminal, a gate terminal, and a body terminal, and the source terminal, the gate terminal, and the body terminal thereof are connected respectively, to cause the Nch depletion mode MOS transistor to function as the current source.

3. The semiconductor integrated circuit device according to claim 2, further comprising:
   a regulator circuit, including at least one another Pch enhancement mode MOS transistor, to adjust the power-supply voltage from the power-supply terminal.

4. The semiconductor integrated circuit device according to claim 3, wherein the regulator circuit comprises:
   a differential amplifier comprises:
      a reference voltage generation pair constituted by an Nch depletion mode MOS transistor and an Nch enhancement mode MOS transistor to generate a reference voltage; and
      a constant current load constituted by a pair of Pch enhancement mode MOS transistors forming a current mirror circuit, source terminals and body terminals of the Pch enhancement mode MOS transistors being connected to the power-supply terminal through the constant current source constituted by the Nch depletion mode transistor;
   a driver transistor constituted by an Nch depletion mode MOS transistor, connected to an output terminal of the differential amplifier, to adjust an output voltage of the regulator circuit; and
   a resistive divider circuit constituted by a pair of resistors, to stabilize the output voltage of the regulator circuit, connected in series to the driver transistor constituted by the Nch depletion mode MOS transistor, an output terminal of the resistive driver circuit being connected to a gate terminal of the Nch enhancement mode MOS transistor in the reference voltage generation pair.

5. The semiconductor integrated circuit device according to claim 3, further comprising:
   an additional constant current source constituted by an Nch depletion mode transistor, the Nch depletion mode MOS transistor including a drain terminal, a source terminal, a gate terminal, and a body terminal, and the source terminal, the gate terminal, and the body terminal of the Nch depletion mode MOS transistor being connected respectively,
   wherein the regulator circuit comprises:
      a reference voltage generation circuit, including an Nch depletion mode MOS transistor and an Nch enhancement mode MOS transistor, to generate a reference voltage;
      a third differential amplifier comprises:
         a differential input pair constituted by a pair of Pch enhancement mode MOS transistors, a gate terminal of one of Pch enhancement mode MOS transistor is connected to an output terminal of the reference voltage generation circuit; and
         an active load constituted by a pair of Nch enhancement mode MOS transistors;
      a second driver transistor constituted by an Nch depletion mode MOS transistor, connected to an output terminal of the differential amplifier, to adjust an output voltage of the regulator circuit; and
      a resistive divider circuit constituted by a pair of resistors, to stabilize the output voltage of the regulator circuit, connected in series to the second driver transistor constituted by the Nch depletion mode MOS transistor, an output terminal of the resistive divider circuit being connected to a gate terminal of the other of Pch enhancement mode MOS transistor in the differential input pair,
   wherein the reference voltage generation circuit and the differential amplifier are connected to the power-supply terminal through the corresponding constant current source and the additional constant current source constituted by the Nch depletion mode transistors, separately.

6. The semiconductor integrated circuit device according to claim 3, wherein the regulator circuit comprises:
wherein the regulator circuit comprises:
a reference voltage generation circuit, including an Nch depletion mode MOS transistor and an Nch enhancement mode MOS transistor, to generate a reference voltage;
a third differential amplifier comprises:
a differential input pair constituted by a pair of Pch enhancement mode MOS transistors, a gate terminal of one of Pch enhancement mode MOS transistor is connected to an output terminal of the reference voltage generation circuit; and
an active load constituted by a pair of Nch enhancement mode MOS transistors;
a second driver transistor constituted by an Nch depletion mode MOS transistor, connected to an output terminal of the differential amplifier, to adjust an output voltage of the regulator circuit; and
a resistive divider circuit constituted by a pair of resistors, to stabilize the output voltage of the regulator circuit, connected in series to the second driver transistor constituted by the Nch depletion mode MOS transistor, an output terminal of the resistive divider circuit being connected to a gate terminal of the other of Pch enhancement mode MOS transistor in the differential input pair,
wherein the reference voltage generation circuit and the differential amplifier are connected to the power-supply terminal through the constant current source constituted by the Nch depletion mode transistor in common.

7. The semiconductor integrated circuit device according to claim 1, wherein the Nch depletion mode MOS transistor including a drain terminal, a source terminal, a gate terminal, and a body terminal, the source terminal and the gate terminal thereof are connected to each other, and the body terminal thereof is connected to a ground terminal, to cause the Nch depletion mode MOS transistor to function as the current source.

8. The semiconductor integrated circuit device according to claim 7, further comprising:
a regulator circuit, including at least one another Pch enhancement mode MOS transistor, to adjust the power-supply voltage from the power-supply terminal.

9. The semiconductor integrated circuit device according to claim 8, wherein the regulator circuit comprises:
a differential amplifier comprises:
a reference voltage generation pair constituted by an Nch depletion mode MOS transistor and an Nch enhancement mode MOS transistor to generate a reference voltage; and
a constant current load constituted by a pair of Pch enhancement mode MOS transistors forming a current mirror circuit, source terminals and body terminals of the Pch enhancement mode MOS transistors being connected to the power-supply terminal through the constant current source constituted by the Nch depletion mode transistor;
a driver transistor constituted by an Nch depletion mode MOS transistor, connected to an output terminal of the differential amplifier, to adjust an output voltage of the regulator circuit; and
a resistive divider circuit constituted by a pair of resistors, to stabilize the output voltage of the regulator circuit, connected in series to the driver transistor constituted by the Nch depletion mode MOS transistor, an output terminal of the resistive driver circuit being connected to a gate terminal of the Nch enhancement mode MOS transistor in the reference voltage generation pair.

10. The semiconductor integrated circuit device according to claim 8, further comprising:
an additional constant source constituted by an Nch depletion mode transistor, the Nch depletion mode MOS transistor including a drain terminal, a source terminal, a gate terminal, and a body terminal, the source terminal and the gate terminal of the Nch depletion mode MOS transistor being connected to each other, and the body terminal thereof being connected to a ground terminal,
wherein the regulator circuit comprises:
a reference voltage generation circuit, including an Nch depletion mode MOS transistor and an Nch enhancement mode MOS transistor, to generate a reference voltage;
a third differential amplifier comprises:
a differential input pair constituted by a pair of Pch enhancement mode MOS transistors, a gate terminal of one of Pch enhancement mode MOS transistor is connected to an output terminal of the reference voltage generation circuit; and
an active load constituted by a pair of Nch enhancement mode MOS transistors;
a second driver transistor constituted by an Nch depletion mode MOS transistor, connected to an output terminal of the differential amplifier, to adjust an output voltage of the regulator circuit; and
a resistive divider circuit constituted by a pair of resistors, to stabilize the output voltage of the regulator circuit, connected in series to the second driver transistor constituted by the Nch depletion mode MOS transistor, an output terminal of the resistive divider circuit being connected to a gate terminal of the other of Pch enhancement mode MOS transistor in the differential input pair,
wherein the reference voltage generation circuit and the differential amplifier are connected to the power-supply terminal through the corresponding constant current source and the additional constant current source constituted by the Nch depletion mode transistors, separately.

11. The semiconductor integrated circuit device according to claim 8, wherein the regulator circuit comprises:
a reference voltage generation circuit, including an Nch depletion mode MOS transistor and an Nch enhancement mode MOS transistor, to generate a reference voltage;
a third differential amplifier comprises:
a differential input pair constituted by a pair of Pch enhancement mode MOS transistors, a gate terminal of one of Pch enhancement mode MOS transistor is connected to an output terminal of the reference voltage generation circuit; and
an active load constituted by a pair of Nch enhancement mode MOS transistors;
a second driver transistor constituted by an Nch depletion mode MOS transistor, connected to an output terminal of the differential amplifier, to adjust an output voltage of the regulator circuit; and
a resistive divider circuit constituted by a pair of resistors, to stabilize the output voltage of the regulator circuit, connected in series to the second driver transistor constituted by the Nch depletion mode MOS transistor, an output terminal of the resistive divider circuit being connected to a gate terminal of the other of Pch enhancement mode MOS transistor in the differential input pair, wherein the reference voltage generation circuit and the differential amplifier are connected to the power-supply terminal through the constant current source constituted by the Nch depletion mode transistor in common.

12. A supply voltage supervisor to monitor a power-supply voltage, the supply voltage supervisor comprising:
a power-supply terminal to which the power-supply voltage is input;
an input terminal to which the power-supply voltage to be monitored is input;
an output terminal to which an abnormal power-supply voltage detection signal is output;
an input-voltage divider circuit constituted by a pair of resistors to divide the power-supply voltage input from the input terminal for output as a divided voltage;
a first differential amplifier including a reference voltage generation pair constituted by a first Nch enhancement mode MOS transistor and a second Nch depletion mode MOS transistor to generate a reference voltage, and a constant current load constituted by a third and a fourth Pch enhancement mode MOS transistor pair forming a current mirror circuit, the first differential amplifier amplifying difference of voltages between the divided voltage from the input-voltage divider circuit and the reference voltage generated in the reference voltage generation pair;
a first inverter including a fifth Pch enhancement mode MOS transistor and a sixth Nch enhancement mode MOS transistor;
a second inverter including a seventh Pch enhancement mode MOS transistor and an eighth Nch enhancement mode MOS transistor;
an output transistor constituted by a ninth Nch enchantment mode MOS transistor to switch on when the divided voltage is smaller than the reference voltage to detect an abnormal power-supply voltage;
an output resistor to pull up the output transistor; and
a constant current source constituted by a tenth Nch depletion mode MOS transistor through which the third, fourth, fifth, and seventh Pch enhancement mode MOS transistors are connected to the power-supply terminal, the constant current source dropping the power-supply voltage input from the power-supply terminal and causing the first differential amplifier, the first inverter, and the second inverter to operate at a voltage dropped from the power-supply voltage input from the power-supply terminal,
wherein the multiple MOS transistors are formed on a silicon-on-insulator substrate including a silicon substrate, a buried-oxide film, and a silicon activate layer, each of the multiple MOS transistors dimensioned so that a bottom of a source diffusion layer and a bottom of a drain diffusion layer reach the buried-oxide film, and
wherein the tenth Nch depletion mode MOS transistor constituting the constant current source has electrical characteristics such that a source voltage thereof is higher than a silicon substrate voltage and a saturation current of the tenth Nch depletion mode MOS transistor is decreased.

13. The supply voltage supervisor according to claim 12, wherein the tenth Nch depletion mode MOS transistor including a drain terminal, a source terminal, a gate terminal, and a body terminal, and the source terminal, the gate terminal, and the body terminal thereof are connected respectively, to cause the tenth Nch depletion mode MOS transistor to function as the current source, in a state in which a substrate bias effect is large.

14. The supply voltage supervisor device according to claim 13, further comprising:
a regulator circuit, provided in a previous stage of the first differential amplifier, the first inverter, and the second inverter, including at least one other Pch enhancement mode MOS transistor, to adjust the power-supply voltage from the power-supply terminal for output to the first differential amplifier, the first inverter, and the second inverter.

15. The supply voltage supervisor device according to claim 14, wherein the regulator circuit comprises:
a second differential amplifier comprises:
a reference voltage generation pair constituted by a eleventh Nch depletion mode MOS transistor and a twelfth Nch enhancement mode MOS transistor to generate a reference voltage; and
a constant current load constituted by a thirteenth and a fourteenth Pch enhancement mode MOS transistors forming a current mirror circuit, source terminals and body terminals of the thirteenth and fourteenth Pch enhancement mode MOS transistors being connected to the power-supply terminal through the constant current source constituted by the tenth Nch depletion mode transistor;
a driver transistor constituted by a fifteenth Nch depletion mode MOS transistor, connected to an output terminal of the second differential amplifier, to adjust an output voltage of the regulator circuit; and
a resistive divider circuit constituted by a pair of resistors, to stabilize the output voltage of the regulator circuit, connected in series to the driver transistor constituted by the fifteenth Nch depletion mode MOS transistor, an output terminal of the resistive driver circuit being connected to a gate terminal of the twelfth Nch enhancement mode MOS transistor in the reference voltage generation pair.

16. The supply voltage supervisor device according to claim 14, further comprising:
an additional constant source constituted by a twenty-second Nch depletion mode transistor, the twenty-second Nch depletion mode MOS transistor including a drain terminal, a source terminal, a gate terminal, and a body terminal, and the source terminal, the gate terminal, and the body terminal of the twenty-second Nch depletion mode MOS transistor being connected respectively,
wherein the regulator circuit comprises:
a reference voltage generation circuit, including a sixteenth Nch depletion mode MOS transistor and a seventeenth Nch enhancement mode MOS transistor, to generate a reference voltage;
a third differential amplifier comprises:
a differential input pair constituted by an eighteenth and a nineteenth Pch enhancement mode MOS transistors, a gate terminal of the eighteenth Pch enhancement mode MOS transistor is connected to an output terminal of the reference voltage generation circuit; and
an active load constituted by a twentieth and a twenty-first Nch enhancement mode MOS transistors;
a second driver transistor constituted by a twelve-third Nch depletion mode MOS transistor, connected to an output terminal of the third differential amplifier, to adjust an output voltage of the regulator circuit; and
a resistive divider circuit constituted by a pair of resistors, to stabilize the output voltage of the regulator circuit, connected in series to the second driver transistor constituted by the twelve-third Nch depletion mode MOS transistor, an output terminal of the resistive divider circuit being connected to a gate terminal of the nineteenth Pch enhancement mode MOS transistor in the differential input pair, wherein the reference voltage generation circuit is connected to the power-supply terminal through the constant current source constituted by the twelve-second Nch depletion mode transistor, and the third differential amplifier is connected to the power-supply terminal through the constant current source constituted by the tenth Nch depletion mode transistor, separately.

17. The supply voltage supervisor according to claim 12, wherein the tenth Nch depletion mode MOS transistor including a drain terminal, a source terminal, a gate terminal, and a body terminal, and the source terminal and the gate terminal thereof are connected to each other, and the body terminal thereof is connected to a ground terminal, to cause the tenth Nch depletion mode MOS transistor to function as the current source, in a state in which a substrate bias effect is small.

18. The supply voltage supervisor device according to claim 17, further comprising:
a regulator circuit, provided in a previous stage of the differential amplifier, the first inverter, and the second inverter, including at least one other Pch enhancement mode MOS transistor, to adjust the power-supply voltage from the power-supply terminal for output to the differential amplifier, the first inverter, and the second inverter.

19. The supply voltage supervisor device according to claim 18, wherein the regulator circuit comprises:
a second differential amplifier comprises:
a reference voltage generation pair constituted by an eleventh Nch depletion mode MOS transistor and a twelfth Nch enhancement mode MOS transistor to generate a reference voltage; and
a constant current load constituted by a thirteenth and a fourteenth Pch enhancement mode MOS transistors forming a current mirror circuit, source terminals and body terminals of the thirteenth and fourteenth Pch enhancement mode MOS transistors being connected to the power-supply terminal through the constant current source constituted by the tenth Nch depletion mode transistor;
a first driver transistor constituted by a fifteenth Nch depletion mode MOS transistor, connected to an output terminal of the second differential amplifier, to adjust an output voltage of the regulator circuit; and
a resistive divider circuit constituted by a pair of resistors, to stabilize the output voltage of the regulator circuit, connected in series to the first driver transistor constituted by the fifteenth Nch depletion mode MOS transistor, an output terminal of the resistive driver circuit being connected to a gate terminal of the twelfth Nch enhancement mode MOS transistor in the reference voltage generation pair.

20. The supply voltage supervisor device according to claim 18, further comprising:
an additional constant source constituted by a twenty-second Nch depletion mode transistor, the twenty-second Nch depletion mode MOS transistor including a drain terminal, a source terminal, a gate terminal, and a body terminal, the source terminal and the gate terminal of the twenty-second Nch depletion mode MOS transistor being connected to each other, and the body terminal thereof being connected to a ground terminal,
wherein the regulator circuit comprises:
a reference voltage generation circuit, including a sixteenth Nch depletion mode MOS transistor and a seventeenth Nch enhancement mode MOS transistor, to generate a reference voltage;
a third differential amplifier comprises:
a differential input pair constituted by an eighteenth and a nineteenth Pch enhancement mode MOS transistors, a gate terminal of the eighteenth Pch enhancement mode MOS transistor is connected to an output terminal of the reference voltage generation circuit; and
an active load constituted by a twentieth and a twenty-first Nch enhancement mode MOS transistors;
a second driver transistor constituted by a twelve-third Nch depletion mode MOS transistor, connected to an output terminal of the third differential amplifier, to adjust an output voltage of the regulator circuit; and
a resistive divider circuit constituted by a pair of resistors, to stabilize the output voltage of the regulator circuit, connected in series to the second driver transistor constituted by the twelve-third Nch depletion mode MOS transistor, an output terminal of the resistive divider circuit being connected to a gate terminal of the nineteenth Pch enhancement mode MOS transistor in the differential input pair,
wherein the reference voltage generation circuit is connected to the power-supply terminal through the constant current source constituted by the twelve-second Nch depletion mode transistor, and the third differential amplifier is connected to the power-supply terminal through the constant current source constituted by the tenth Nch depletion mode transistor, separately.

* * * * *